US012757484B2

(12) United States Patent
Chu et al.

(10) Patent No.: US 12,757,484 B2
(45) Date of Patent: Oct. 6, 2026

(54) INTEGRATED CIRCUIT DEVICE WITH REDUCED N-P BOUNDARY EFFECT

(71) Applicant: Intel Corporation, Santa Clara, CA (US)

(72) Inventors: Tao Chu, Portland, OR (US); Yanbin Luo, Portland, OR (US); Yusung Kim, Portland, OR (US); Minwoo Jang, Portland, OR (US); Paul Packan, Hillsboro, OR (US); Guowei Xu, Portland, OR (US); Chiao-Ti Huang, Portland, OR (US); Robin Chao, Portland, OR (US); Feng Zhang, Hillsboro, OR (US); Yang Zhang, Rio Rancho, NM (US); Zheng Guo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/187,801

(22) Filed: Mar. 22, 2023

(65) Prior Publication Data

US 2024/0321887 A1 Sep. 26, 2024

(51) Int. Cl.
*H10D 84/85* (2025.01)
*H10D 64/66* (2025.01)

(52) U.S. Cl.
CPC ......... *H10D 84/856* (2025.01); *H10D 64/667* (2025.01)

(58) Field of Classification Search
CPC ..... H10D 84/85; H10D 30/021; H10D 84/856
See application file for complete search history.

(56) References Cited

U.S. PATENT DOCUMENTS

2019/0139967 A1* 5/2019 Mann .................... G11C 11/412

* cited by examiner

*Primary Examiner* — Mohammad A Rahman
(74) *Attorney, Agent, or Firm* — Akona IP PC

(57) ABSTRACT

An IC device may have layout with reduced N-P boundary effect. The IC device may include two rows of transistors. The first row may include one or more P-type transistors. The second row may include N-type transistors. The gate electrode of a P-type transistor may include different conductive materials from the gate electrode of a N-type transistor. Each P-type transistor in the first row may be over a N-type transistor in the second row and contact the N-type transistor in the second row. For instance, the gate of the P-type transistor may contact the gate of the N-type transistor. Vacancy diffusion may occur at the boundary of the P-type transistor and the N-type transistor, causing N-P boundary effect. At least one or more other N-type transistors in the second row do not contact any P-type transistor, which can mitigate the N-P boundary effect in the IC device.

20 Claims, 9 Drawing Sheets

INTEGRATED CIRCUIT DEVICE WITH REDUCED N-P BOUNDARY EFFECT

BACKGROUND

Integrated circuit (IC) fabrication usually includes two stages. The first stage is referred to as the front end of line (FEOL). The second stage is referred to as the back end of line (BEOL). In the FEOL, individual semiconductor devices components (e.g., transistor, capacitors, resistors, etc.) can be patterned in a wafer. The physical layout of the semiconductor devices or their proximity to each other may impact the electrical characteristics of the semiconductor devices. For instance, the boundary effect due to different types of transistors contacting each other can negatively impact the threshold voltages of the transistors. In the BEOL, metal layers, vias, and insulating layers can be formed to get the individual components interconnected. The BEOL usually starts with forming the first metal layer on the wafer. The first metal layer is often called M0. More metal layers can be formed on top of M0, and these metal layers are often called M1, M2, and so on.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
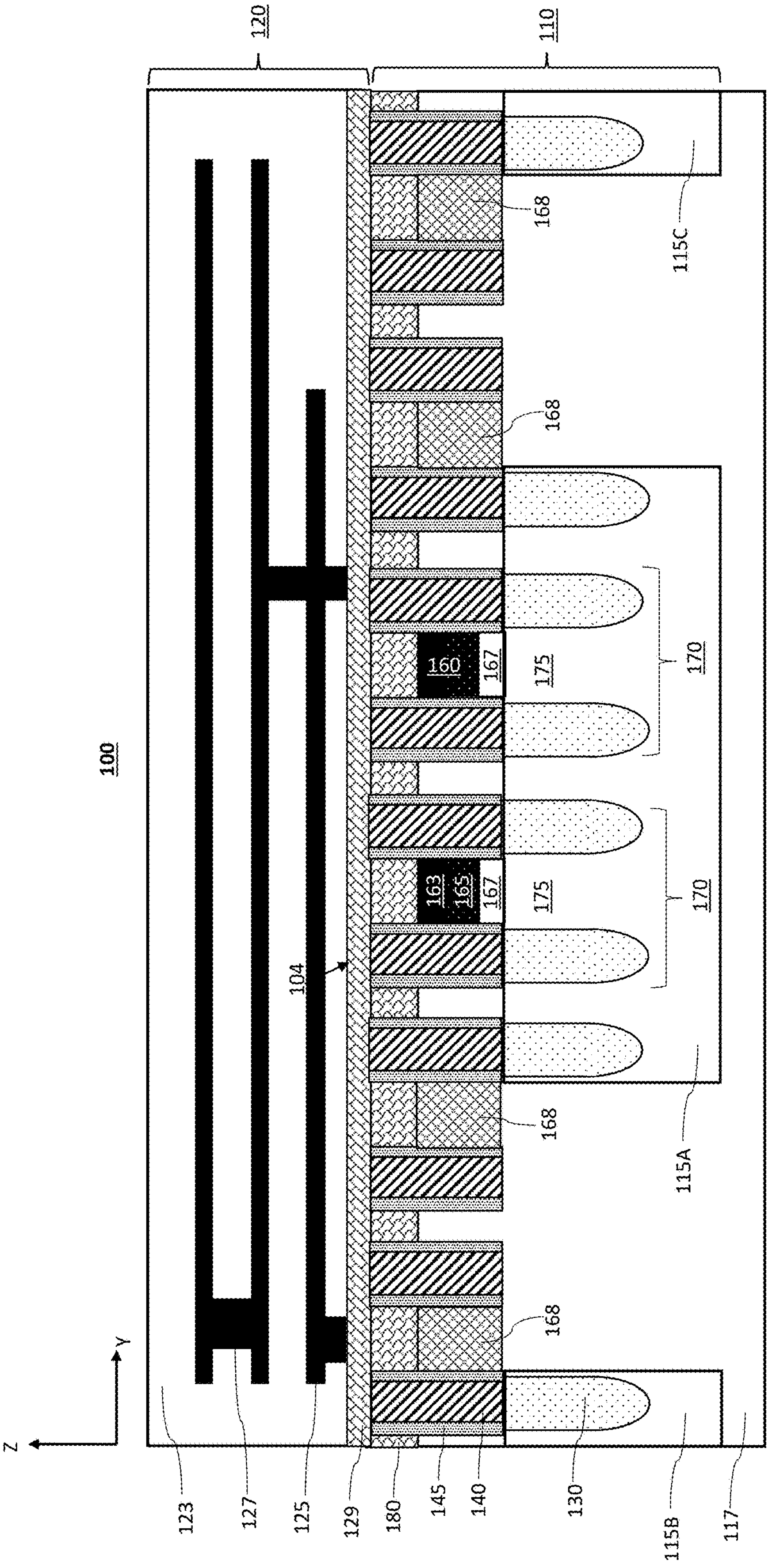
FIG. 1 illustrates an IC device comprising an FEOL section and a BEOL section, according to some embodiments of the disclosure.

The systems, methods, and devices of this disclosure each have several innovative aspects, no single one of which is solely responsible for all the desirable attributes disclosed herein. Details of one or more implementations of the subject matter described in this specification are set forth in the description below and the accompanying drawings.

Many circuit devices include a large array of semiconductor devices, e.g., transistors. Examples of transistors in these circuit devices include MOSFET (metal-oxide-semiconductor field-effect transistor), such as NMOS (N-type metal-oxide-semiconductor) FET (field-effect transistor), PMOS (P-type metal-oxide-semiconductor) FET, and so on. However, the performance of a circuit device can be negatively impacted by local layout effects, i.e., environmental effects that can impact the electrical characteristics of a semiconductor device due to the physical layout of the circuit, such as proximity of the semiconductor device to other features in the circuit. Continued scaling of transistors creates additional challenges, as the scaling of transistors can introduce stronger local layout effects that influence circuit functionality. For instance, local layout effects can influence the threshold voltage ($V_T$) of transistors in a memory device (e.g., a SRAM (static random-access memory)). $V_T$ is the required gate voltage to turn on the transistors.

A currently available IC in a memory device may include a plurality of N-P boundaries that can cause significant N-P boundary effect. For instance, an IC device may have a group of N-type transistors over a group of P-type transistors. Each N-type transistor (e.g., a NMOS transistor) contacts a P-type transistor (e.g., a PMOS transistor), e.g., the channel regions (or gates) of the two transistors are connected. As the two transistors have different vacancy concentrations, there can be an exchange of vacancies (e.g., oxygen vacancies) between the two transistors. For example, vacancies can diffuse from the channel region of the N-type transistor to the P-type transistor. With such N-P boundary effect, the transistors can weaken each other and have higher $V_T$. The increase in $V_T$ may break the $V_{min}$ target in simulation. Additionally, some applications of IC devices require or prefer the IC devices to have low $V_T$.

Embodiments of the present disclosure may improve on at least some of the challenges and issues described above by reducing or minimizing N-P boundary effect in IC devices. For instance, a bipolar layout, which may include a N-type transistor and a P-type transistor contacting each other, may be converted to a unipolar layout that includes two transistors of the same time, such as two N-type transistors. Compared with the bipolar layout, the unipolar layout has less or even no N-P boundary effect.

In various embodiments of the present disclosure, an IC device may include an array of transistors, in which the transistors may be arranged in one or more rows, or rows and columns. In an example, some or all the transistors in the same row may share a support structure (e.g., a substrate) that includes one or more semiconductor materials. The source, channel, and drain regions of the transistors may be formed based on different portions of the support structure. Each transistor may include a gate that is over the channel region. A gate may include an electrically conductive material, such as polysilicon, metal, and so on. The IC device may include two rows, with the first row over the second row in a first direction. The first row includes one or more P-type transistors (e.g., PMOS transistor). The second row includes a plurality of N-type transistors. Each P-type transistor in the first row can be connected to a N-type transistor in the second row, which constitute a bipolar layout. The bipolar layout can cause N-P boundary effect. One or more portions of the IC device also has a unipolar layout. The unipolar layout portion(s) may include one or more N-type transistors in the second row, but there are no P-type transistor in the first row that are connected to or over the one or more N-type transistors. In the unipolar layout portions of the IC device, the N-P boundary effect is minimal or none. Even though the IC device includes bipolar layout, the presence of the unipolar layout can mitigate the N-P boundary effect. Therefore, compared with conventionally available memory devices, the IC devices in the present disclosure can have lower $V_T$ and better performance.

It should be noted that, in some settings, the term "nanoribbon" has been used to describe an elongated semiconductor structure that has a substantially rectangular transverse cross-section (e.g., a cross-section in a plane perpendicular to the longitudinal axis of the structure), while the term "nanowire" has been used to describe a similar structure but with a substantially circular or square transverse cross-sections. In the following, a single term "nanoribbon" is used to describe an elongated semiconductor structure independent of the shape of the transverse cross-section. Thus, as used herein, the term "nanoribbon" is used to cover elongated semiconductor structures that have substantially rectangular transverse cross-sections (possibly with rounded corners), elongated semiconductor structures that have substantially square transverse cross-sections (possibly with rounded corners), elongated semiconductor structures that have substantially circular or elliptical/oval transverse cross-sections, as well as elongated semiconductor structures that have any polygonal transverse cross-sections.

In the following, some descriptions may refer to a particular source or drain (S/D) region or contact being either a source region/contact or a drain region/contact. However, unless specified otherwise, which region/contact of a transistor or diode is considered to be a source region/contact and which region/contact is considered to be a drain region/contact is not important because, as is common in the field of FETs, designations of source and drain are often interchangeable. Therefore, descriptions of some illustrative embodiments of the source and drain regions/contacts provided herein are applicable to embodiments where the designation of source and drain regions/contacts may be reversed.

As used herein, the term "metal layer" may refer to a layer above a substrate that includes electrically conductive interconnect structures for providing electrical connectivity between different IC components. Metal layers described herein may also be referred to as "interconnect layers" to clearly indicate that these layers include electrically conductive interconnect structures which may, but do not have to be, metal.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−10%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−8% of a target value, e.g., within +/−5% of a target value or within +/−2% of a target value, based on the context of a particular value as described herein or as known in the art. Also, the term "or" refers to an inclusive "or" and not to an exclusive "or."

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 7A-7B, such a collection may be referred to herein without the letters, e.g., as "FIG. 7."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of semiconductor devices with reduced N-P boundary effect as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with reduced N-P boundary effect as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors; optoelectronics, logic blocks, audio amplifiers, etc., depending on the components associated with the IC. The IC may be employed as part of a chipset for executing one or more related functions in a computer.

FIG. 1 illustrates an IC device 100 comprising an FEOL section 110 and a BEOL section 120, according to some embodiments of the disclosure. For the purpose of illustration, FIG. 1 shows a cross-sectional view of the IC device 100 in the Y-Z plane. The FEOL section 110 includes support structures 115A-115C (collectively referred to as "support structures 115" or "support structure 115"), electrical insulator 117, semiconductor regions 130 (individually referred to as "semiconductor region 130"), gate electrodes 160 (individually referred to as "gate electrode 160"), gate insulators 167 (individually referred to as "gate insulator 167"), gate structures 168 (individually referred to as "gate structure 168"), and a dielectric layer 180. The BEOL section 120 includes an insulative structure 123, metal layers 125 (individually referred to as "metal layer 115"), vias 127 (individually referred to as "via 117"), and a contact layer 129. In other embodiments, the IC device 100 may include fewer, more, or different components. For example, the FEOL section 110 may include a different number of transistor(s) 170A or 170B. Also, the FEOL section 110 may include other types of semiconductor devices, such as resistor, capacitor, inductor, etc. As another example, the BEOL section 120 may include a different number of metal layers 125 or a different number of vias 127.

Each support structure 115 may be any suitable structure, such as a substrate, a die, a wafer, or a chip, based on which transistors can be built. A support structure 115 may, e.g., be the wafer 2000 of FIG. 6A, discussed below, and may be, or be included in, a die, e.g., the singulated die 2002 of FIG. 6B, discussed below. In some embodiments, a support structure 115 may be a semiconductor substrate composed of semiconductor material systems including, for example, N-type or P-type materials systems. In an embodiment, the support structure 115 may include one or more N-type semiconductor materials. In some embodiments, a support structure 115 may be a N-type semiconductor substrate, based on which P-type transistors may be formed. A support structure 115 may have a longitudinal axis along the Y axis. The support structure 115 may have a transvers cross-section perpendicular to the longitudinal axis. For instance, the transvers cross-section may be in the X-Z plane. In some embodiments, a dimension of the support structure 115 along the longitudinal axis may be greater than dimensions along other directions, e.g., directions along axes perpendicular to the longitudinal axis.

In some embodiments, the semiconductor substrate may be a crystalline substrate formed using a bulk silicon or a silicon-on-insulator substructure. In other embodiments, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. In some embodiments, the substrate may be non-crystalline. In some embodiments, the support structure may be a printed circuit board (PCB) substrate. One or more transistors may be built on the support structure 115.

Although a few examples of materials from which the support structure 115 may be formed are described here, any material that may serve as a foundation upon which an IC may be built falls within the spirit and scope of the present disclosure. In various embodiments, the support structure 115 may include any such substrate, possibly with some layers and/or devices already formed thereon, not specifically shown in the present figures. As used herein, the term "support" does not necessarily mean that it provides mechanical support for the IC devices/structures (e.g., transistors, capacitors, interconnects, and so on) built thereon. For example, some other structure (e.g., a carrier substrate or a package substrate) may provide such mechanical support and the support structure 115 may provide material "support" in that, e.g., the IC devices/structures described herein are build based on the semiconductor materials of the support structure 115. However, in some embodiments, the support structure 115 may provide mechanical support.

Each support structures 115 is at least partially surrounded by the electrical insulator 117. The electrical insulator 117 may include one or more electrical insulators, such as dielectric materials or hysteretic materials. Example dielectric material includes oxide (e.g., Si based oxides, metal oxides, etc.), high-k dielectric, and so on. Example hysteretic material includes ferroelectric materials, antiferroelectric materials, etc. The electrical insulator 117 may separate components in the IC device 100 to insulate them from each other.

As shown in FIG. 1, two transistors 170 (individually referred to as "transistor 170") are formed based on the support structure 115A. A transistor 170 may be a FET, such as MOSFET, tunnel FET (TFET), fin-based transistor (e.g., FinFET), nanoribbon-based transistor, gate-all-around (GAA) transistor, other types of FET, or some combination thereof. A transistor 170 includes two semiconductor regions 130 that constitute the source region and drain region, respectively. The two semiconductor regions 130 may be formed at least partially in the support structure 115A. In some embodiments, the two semiconductor regions 130 may be formed by doping two portions of the support structure 115. The transistor 170 also includes a channel region 175 between the two semiconductor regions 130. The channel region 175 may be a portion of the support structure 115A. The two semiconductor regions 130 and the channel region constitute a semiconductor structure of the transistor 170. The semiconductor structure of the transistor 170 (or a portion of the semiconductor structure, e.g., the channel region) may be a planar structure or a non-planar structure. A non-planar structure is a three-dimensional structure, such as fin, nanoribbon (e.g., nanosheet, nanowire, etc.), and so on. A non-planar structure may have a longitudinal axis and a transvers cross-section perpendicular to the longitudinal axis. In some embodiments, a dimension of the non-planar structure along the longitudinal axis may be greater than dimensions along other directions, e.g., directions along axes perpendicular to the longitudinal axis.

A channel region 175 of a transistor 170 may include a channel material. The channel material may be composed of semiconductor material systems including, for example, N-type or P-type materials systems. In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material may include a compound semiconductor with a first sub-lattice of at least one element from Group III of the periodic table (e.g., Al, Ga, In), and a second sub-lattice of at least one element of group V of the periodic table (e.g., P, As, Sb). In some embodiments, the channel material may include a compound semiconductor with a first sub-lattice of at least one element from Group II of the periodic table (e.g., Zn, Cd, Hg), and a second sub-lattice of at least one element of Group IV of the periodic table (e.g., C, Si, Ge, Sn, Pb). In some embodiments, the channel material is an epitaxial semiconductor material deposited using an epitaxial deposition process. The epitaxial semiconductor material may have a polycrystalline structure with a grain size between about 2 nm and 100 nm, including all values and ranges therein.

For some example N-type transistor embodiments (i.e., for the embodiments where a transistor 170 is an NMOS transistor or an N-type TFET), the channel material may advantageously include a III-V material having a high electron mobility, such as, but not limited to InGaAs, InP, InSb, and InAs. For some such embodiments, the channel material may be a ternary III-V alloy, such as InGaAs, GaAsSb, InAsP, or InPSb. For some InxGa1-xAs fin embodiments, In content (x) may be between 0.6 and 0.9, and may advantageously be at least 0.7 (e.g., In0.7Ga0.3As). In some embodiments with highest mobility, the channel material may be an intrinsic III-V material, i.e., a III-V semiconductor material not intentionally doped with any electrically active impurity. In alternate embodiments, a nominal impurity dopant level may be present within the channel material, for example to further fine-tune a threshold voltage Vt, or to provide HALO pocket implants, etc. Even for impurity-doped embodiments however, impurity dopant level within the channel material may be relatively low, for example below $10^{15}$ dopant atoms per cubic centimeter ($cm^{-3}$), and advantageously below $10^{13}$ $cm^{-3}$. These materials may be amorphous or polycrystalline, e.g., having a crystal grain size between 0.5 nanometers and 100 nanometers.

For some example P-type transistor embodiments (i.e., for the embodiments where a transistor 170 is a PMOS transistor or a P-type TFET), the channel material may advantageously be a Group IV material having a high hole mobility, such as, but not limited to Ge or a Ge-rich SiGe alloy. For some example embodiments, the channel material may have a Ge content between 0.6 and 0.9, and advantageously may be at least 0.7. In some embodiments with highest mobility, the channel material may be intrinsic III-V (or IV for P-type devices) material and not intentionally doped with any electrically active impurity. In alternate embodiments, one or more a nominal impurity dopant level may be present within the channel material, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$. These materials may be amorphous or polycrystalline, e.g., having a crystal grain size between 0.5 nanometers and 100 nanometers.

In some embodiments, the channel material may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, aluminum zinc oxide, or tungsten oxide. In general, for a thin-film transistor (TFT), the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, molybdenum disulfide, n- or P-type amorphous or polycrystalline silicon, monocrystalline silicon, germanium, indium arsenide, indium gallium arsenide, indium selenide, indium antimonide, zinc antimonide, antimony selenide, silicon germanium, gallium nitride, aluminum gallium nitride, indium phosphite, black phosphorus, zinc sulfide, indium sulfide, gallium sulfide, each of which may possibly be doped with one or more of gallium, indium, aluminum, fluorine, boron, phosphorus, arsenic, nitrogen, tantalum, tungsten, and magnesium, etc. In some embodiments, a thin-film channel material may be deposited at relatively low temperatures, which allows depositing the channel material within the thermal budgets imposed on back-end fabrication to avoid damaging other components, e.g., front end components such as logic devices.

As noted above, the channel material may include IGZO. IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors.

IGZO can be deposited as a uniform amorphous phase while retaining higher carrier mobility than oxide semiconductors such as zinc oxide. Different formulations of IGZO include different ratios of indium oxide, gallium oxide, and zinc oxide. One particular form of IGZO has the chemical formula $InGaO_3(ZnO)_5$. Another example form of IGZO has an indium:gallium:zinc ratio of 1:2:1. In various other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

The source region and drain region in a transistor 170 are connected to the channel region 175. The source region and drain region may each include a semiconductor material with dopants. In some embodiments, the source region and drain region have the same semiconductor material, which may be the same as the channel material of the channel region 175. A semiconductor material of the source region or the drain region may be a Group IV material, a compound of Group IV materials, a Group III/V material, a compound of Group III/V materials, a Group II/VI material, a compound of Group II/VI materials, or other semiconductor materials. Example Group II materials include zinc (Zn), cadmium (Cd), and so on. Example Group III materials include aluminum (Al), boron (B), indium (In), gallium (Ga), and so on. Example Group IV materials include silicon (Si), germanium (Ge), carbon (C), etc. Example Group V materials include nitrogen (N), phosphorus (P), arsenic (As), antimony (Sb), and so on. Example Group VI materials include sulfur(S), selenium (Se), tellurium (Te), oxygen (O), and so on. A compound of Group IV materials can be a binary compound, such as SiC, SiGe, and so on. A compound of Group III/V materials can be a binary, tertiary, or quaternary compound, such as GaN, InN, and so on. A compound of Group II/VI materials can be a binary, tertiary, or quaternary compounds, such as CdSe, CdS, CdTe, ZnO, ZnSe, ZnS, ZnTe, CdZnTe, CZT, HgCdTe, HgZnTe, and so on.

In some embodiments, the dopants in the source region and the drain region are the same type. In other embodiments, the dopants of the source region and the drain region may be different (e.g., opposite) types. In an example, the source region has N-type dopants and the drain region has P-type dopants. In another example, the source region has P-type dopants and the drain region has N-type dopants. Example N-type dopants include Te, S, As, tin (Sn), Si, Ga, Se, S, In, Al, Cd, chlorine (Cl), iodine (I), fluorine (F), and so on. Example P-type dopants include beryllium (Be), Zn, magnesium (Mg), Sn, P, Te, lithium (Li), sodium (Na), Ga, Cd, and so on.

In some embodiments, the source region and the drain region may be highly doped, e.g., with dopant concentrations of about $1 \cdot 10^{21}$ $cm^{-3}$, in order to advantageously form Ohmic contacts with the respective S/D contacts (also sometimes interchangeably referred to as "S/D electrodes"), although these regions may also have lower dopant concentrations and may form Schottky contacts in some implementations. Irrespective of the exact doping levels, the source region and the drain region may be the regions having dopant concentration higher than in other regions, e.g., higher than a dopant concentration in the channel region 175, and, therefore, may be referred to as "highly doped" (HD) regions.

The channel region 175 may include one or more semiconductor materials with doping concentrations significantly smaller than those of the source region and the drain region. For example, in some embodiments, the channel material of the channel region 175 may be an intrinsic (e.g., undoped) semiconductor material or alloy, not intentionally doped with any electrically active impurity. In alternate embodiments, nominal impurity dopant levels may be present within the channel material, for example to set a threshold voltage Vt, or to provide HALO pocket implants, etc. In such impurity-doped embodiments however, impurity dopant level within the channel material is still significantly lower than the dopant level in the source region and the drain region, for example below $10^{15}$ $cm^{-3}$ or below $10^{13}$ $cm^{-3}$. Depending on the context, the term "S/D terminal" may refer to a S/D region or a S/D contact or electrode of a transistor.

Each transistor 170 also includes a trench contact 140 over each of the two semiconductor regions 130. A trench contact 140 may include one or more electrically conductive materials to couple the source or drain region to a power plane or ground plane, which may be one or more metal layers 125 in the BEOL section 120. An electrically conductive material may be metal. Examples of metals in the trench contacts 140 may include, but are not limited to, Ru, Cu, Co, palladium (Pd), platinum (Pt), nickel (Ni), and so on. In the embodiments of FIG. 1, each trench contact 140 is wrapped around by a spacer 145. The spacer 145 may be electrically insulative. The spacer 145 may include an electrical insulator, such as a dielectric material, hysteretic material, and so on. Example dielectric material includes oxide (e.g., Si based oxides, metal oxides, etc.), high-k dielectric, and so on. Example hysteretic material include ferroelectric materials, antiferroelectric materials, etc. The spacer 145 can insulate the trench contact 140 from other electrically conductive structures, such as the gate electrode of the transistor 170.

Each transistor 170 further includes a gate over at least part of the channel region 175. Embodiments of the gate may include the gate 320 in FIG. 3, the gate 443 in FIG. 4, and the gate 553 in FIG. 5. The gate of a transistor 170 includes a gate electrode 160 and a gate insulator 167. The gate electrode 160 includes one or more conductive materials. The choice of the conductive materials in the gate electrodes may depend on whether the transistor 170 is a P-type transistor or an N-type transistor. For a P-type transistor, gate electrode materials that may be used in different portions of the gate electrode may include, but are not limited to, Ru, Pd, Pt, Co, Ni, and conductive metal oxides (e.g., ruthenium oxide). For an N-type transistor, gate electrode materials that may be used in different portions of the gate electrode, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode may include a stack of a plurality of gate electrode materials, where zero or more materials of the stack are work function materials and at least one material of the stack is a fill metal layer. Further materials/layers may be included next to the gate electrode for other purposes, such as to act as a diffusion barrier layer or/and an adhesion layer.

The gate insulator 167 is between the gate electrode 160 and the channel region 175. The gate insulator 167 may include one or more electrical insulators, such as dielectric materials or hysteretic materials. Example dielectric material includes oxide (e.g., Si based oxides, metal oxides, etc.), high-k dielectric, and so on. Example hysteretic material includes ferroelectric materials, antiferroelectric materials, etc. In some embodiments, the gate insulator 167 may include the same electrical insulator as the electrical insulator 117. In some embodiments, the gate insulator 167 may wrap around at least a portion of the channel region 175. At least a portion of the gate insulator 167 may be wrapped around by the gate electrode 160.

In some embodiments, a transistor 170 is a P-type transistor, such as a PMOS transistor. The source region and drain region of the transistor 170 may include one or more P-type semiconductor materials. The support structure 115A may be a N-type semiconductor substrate. The gate electrode 160 includes one or more P-type conductive materials, such as polycrystalline silicon, metal, and so on. In some embodiments (e.g., embodiments where the gate electrode 160 includes a metal), the work function of the gate electrode 160 or a conductive material in the gate electrode 160 may be close to the valence band of silicon, e.g., close to approximately 5 eV. As shown in FIG. 1, the gate electrode 160 includes a first conductive structure 163 and a second conductive structure 165. The two conductive structures may include different conductive materials. In an example, the first conductive structure 163 may include Titanium Aluminum Carbide, while the second conductive structure 165 may include Titanium Nitride.

At least at portion of the first conductive structure 163 is over at least a portion the second conductive structure 165 along the Z axis. As shown in FIG. 1, the second conductive structure 165 is between the first conductive structure 163 and the gate insulator 167. In other embodiments, the second conductive structure 165 may be at least partially wrapped by the first conductive structure 163. In some embodiments, the thickness of the first conductive structure 163A, e.g., in a direction along the Z axis, may be in a range from approximately 3 nanometers to 5 nanometers. The thickness of the second conductive structure 165 may be in a range from approximately 1 nanometer to 5 nanometers. An example of the first conductive structure 163 may be the conductive structure 323 in FIG. 3. An example of the second conductive structure 165 may be the conductive structure 325 in FIG. 3. An example of the gate insulator 167 may be the insulative structure 327 in FIG. 3.

Even though not shown in FIG. 1, the transistors 170 in the IC device 100 may be over other transistors, e.g., a group of N-type transistors. Each transistor 170 may be arranged over a N-type transistor and may contact the N-type transistor. For instance, the gate electrode 160 may contact the gate electrode of the N-type transistor. Such as N-P boundary can increase the threshold voltage of the transistors. Embodiments of the transistors 170 may include the transistors 440 in FIG. 4 and the transistors 550 in FIG. 5.

In some embodiments, the gate electrodes 160 may include one or more different materials from a conductive structure (e.g., a gate electrode) in a gate structure 168. A gate structure 168 may be a N-type gate and may include one or more N-type conductive materials, such as polycrystalline silicon, metal, and so on. In an example, the gate structure 168 includes Titanium Aluminum Carbide. In some embodiments, the gate structure 168 includes a layer of a conductive material. The thickness of the layer, e.g., in a direction along the Z axis, may be in a range from approximately 3 nanometers to 5 nanometers. In some embodiments (e.g., embodiments where the gate structure 168 includes a metal), the work function of the gate structure 168 or a conductive material in the gate structure 168 may be close to the conduction band of silicon, e.g., close to approximately 4.1 eV. Each gate structure 168 is over a portion of the electrical insulator 117 in the Y-Z plane shown in FIG. 1. In some embodiments, the gate structure 168 contacts the portion of the electrical insulator 117. There may be no semiconductor structure or semiconductor region between the gate structure 168 and the portion of the electrical insulator 117. Embodiments of the gate structure 168 includes the gate 310 in FIG. 3, the gate structures 463 in FIG. 4, and the gate structures 563 in FIG. 5.

The dielectric layer 180 is between the gate electrodes 160 and the contact layer 129 in the BEOL section 120. The dielectric layer 180 may insulate the trench contacts 140 from each other. The dielectric layer 180 may also separate and insulate the gate electrodes 160 from the contact layer 129. The dielectric layer 180 may contact the bottom surface of the contact layer 129. The contact layer 129 may be electrically conductive. In the embodiments of FIG. 1, different portions of the contact layer 129 contacts the top surfaces of the trench contacts 140, respectively. Electrical signals can be provided to the trench contacts 140 and further to the semiconductor regions 130 through the contact layer 129. The contact layer 129 is electrically coupled to the metal layers 125 through the vias 127.

The metal layers 125 may facilitate supply of electrical signals to the transistor 170. Even though not shown in FIG. 1, the metal layers 125 may be coupled with other devices than the transistor 170, such as diodes, power sources, resistors, capacitors, inductors, sensors, transceivers, receivers, antennas. A via 127 may include a metal, such as tungsten (W), molybdenum (Mo), ruthenium (Ru), or other metals. Different vias 127 may include different materials. The vias 127 can provide a conductive channel between the metal layers 125. The metal layers 125, vias 127, or contact layer 129 may be partially or wholly surrounded by the insulative structure 123. Certain portions of the metal layers 125, vias 127, or contact layer 129 may be insulated by the insulative structure 123. The insulative structure 123 may include one or more electrical insulators. An electrical insulator may be a dielectric material, hysteretic material, and so on. Example dielectric material includes oxide (e.g., Si based oxides, metal oxides, etc.), low-k dielectric, high-k dielectric, and so on. Example hysteretic material include ferroelectric materials, antiferroelectric materials, etc.

Figure 2:
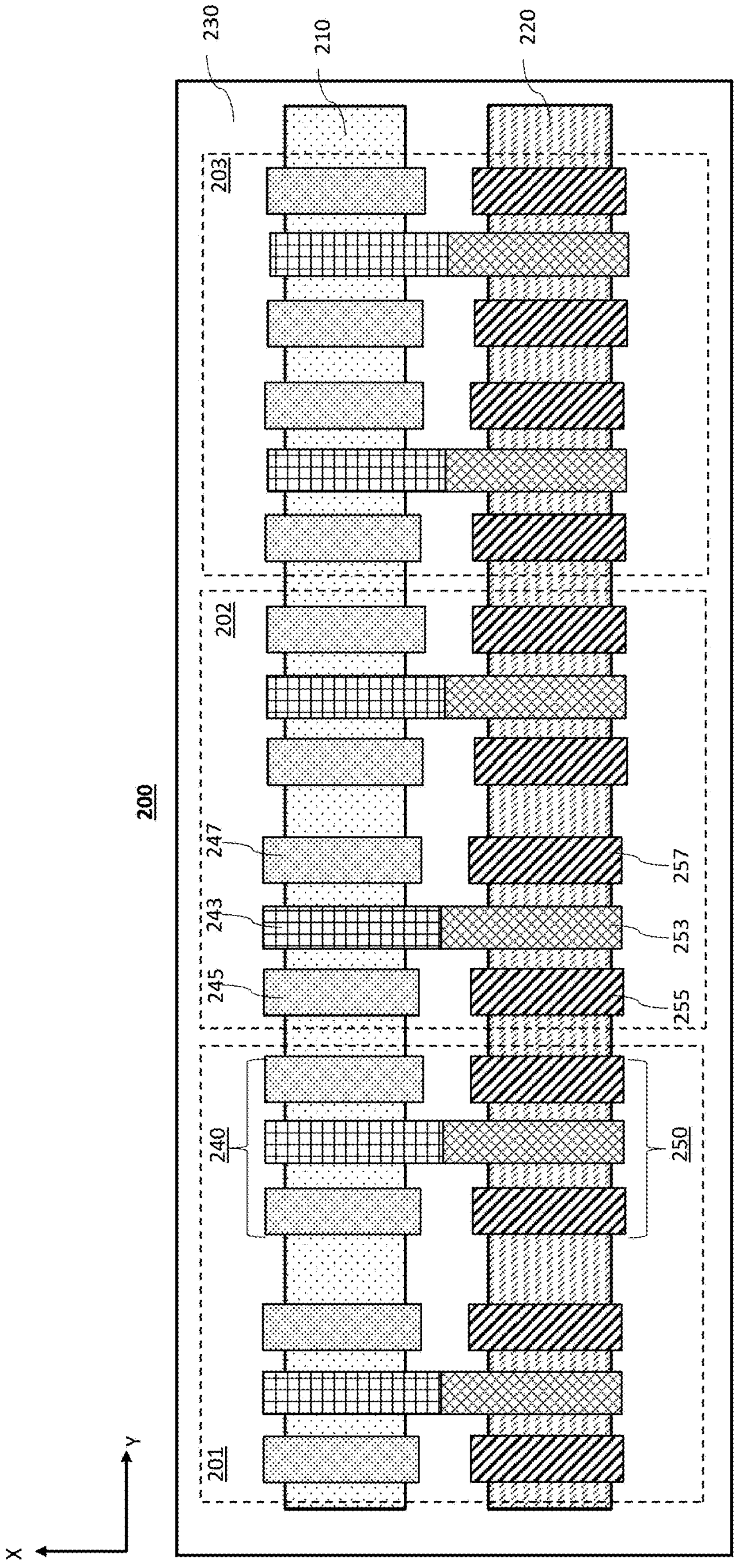
FIG. 2 illustrates an IC device with N-P boundary effect, according to some embodiments of the disclosure.

FIG. 2 illustrates an IC device 200 with N-P boundary effect, according to some embodiments of the disclosure. The IC device 200 includes a support structure 210, another support structure 220, an electrical insulator 230, a sequence of transistors 240 (individually referred to as "transistor 240") associated with the support structure 210, and a sequence of transistors 250 (individually referred to as "transistor 250") associated with the support structure 220. In other embodiments, the IC device 200 may include fewer, more, or different components. The IC device 200 may be used as a memory device or part of a memory device, such as SRAM. In some embodiments, the IC device 200 may be used as at least part of a register file.

The support structure 210 or 220 may include one or more semiconductor materials. In some embodiments, the support structure 210 or 220 may be a semiconductor substrate based on which the transistors 240 or 250 can be formed. In some embodiments, the support structures 210 and 220 may include opposite types of semiconductors. For instance, the support structure 210 may be a N-type semiconductor substrate, while the support structure 210 may be a P-type semiconductor substrate. The support structure 210 or 220 may be an embodiment of the support structure 115 in FIG. 1.

The support structures 210 and 220 (or the transistors 240 and 250) may be partially or wholly surrounded by the electrical insulator 230. The electrical insulator 230 may separate and insulate semiconductor components or conductive components in the support structures 210 and 220 (or the transistors 240 and 250). The electrical insulator 230 may include one or more electrical insulative materials, such as a dielectric material, hysteretic material, and so on. Example dielectric material includes oxide (e.g., Si based oxides, metal oxides, etc.), high-k dielectric, and so on. Example hysteretic material include ferroelectric materials, antiferroelectric materials, and so on.

A transistor 240 or 250 may be a MOSFET, such as p-MOSFET or n-MOSFET. In some embodiments, the transistors 240 may be the same type of transistor as each other, and the transistors 250 may be the same type of transistor as each other. The transistors 240 may be an opposite type of transistors from the transistors 250. For instance, the transistors 240 may be P-type transistors, while the transistors 250 may be N-type transistors. Each transistor 240 includes a gate 243; a source region 245, and a drain region 247. Even though FIG. 2 shows six transistors 240 and six transistors 250, the IC device 200 may include a different number of transistors 240 or 250. The IC device 200 may include two pass-gate sections 201 and 203 and a pull-down section 202. The pull-down section 202 is between the two pass-gate sections 201 and 203. Each of these sections is represented by a dashed rectangular in FIG. 2. The pass-gate section 201 includes two transistors 240 and two transistors 250, and these four transistors may be pass-gate transistors. Similarly, the pass-gate section 203 includes two transistors 240 and two transistors 250, and these four transistors may be pass-gate transistors. The pull-down section 202 includes two transistors 240 and two transistors 250, and these four transistors may be pull-down transistors.

In some embodiments (e.g., embodiments where each transistor 240 is a P-type transistor), the gate 243 may include one or more P-type gate electrodes. The gate 243 may also include a gate insulator. The source region 245 and drain region 246 may include one or more P-type semiconductor materials. Even though now shown in FIG. 2, a transistor 240 also includes a channel region between the source region 245 and drain region 246. The channel region may be the portion of the support structure 210, which may be a N-type semiconductor substrate. The channel region may be over the gate 243, e.g., along a Z axis that is perpendicular to the X-Y plane. The channel region may be at least partially wrapped by the gate insulator in the gate 243.

In some embodiments (e.g., embodiments where each transistor 250 is a N-type transistor), the gate 253 may include one or more N-type gate electrodes. The gate 253 may also include a gate insulator. The source region 255 and drain region 256 may include one or more N-type semiconductor materials. Even though now shown in FIG. 2, a transistor 250 also includes a channel region between the source region 255 and drain region 256. The channel region may be the portion of the support structure 220, which may be a P-type semiconductor substrate. The channel region may be over the gate 253, e.g., along a Z axis that is perpendicular to the X-Y plane.

As shown in FIG. 2, each gate 243 contacts a gate 253. That may cause N-P boundary effect (such as the N-P boundary effect described below in conjunction with FIG. 3) in the IC device 200. As every transistor 240 contacts a transistor 250, the N-P boundary effect can be significant, resulting in undesirable increase in the threshold voltages of the transistors 240, transistors 250, or both.

Figure 3:
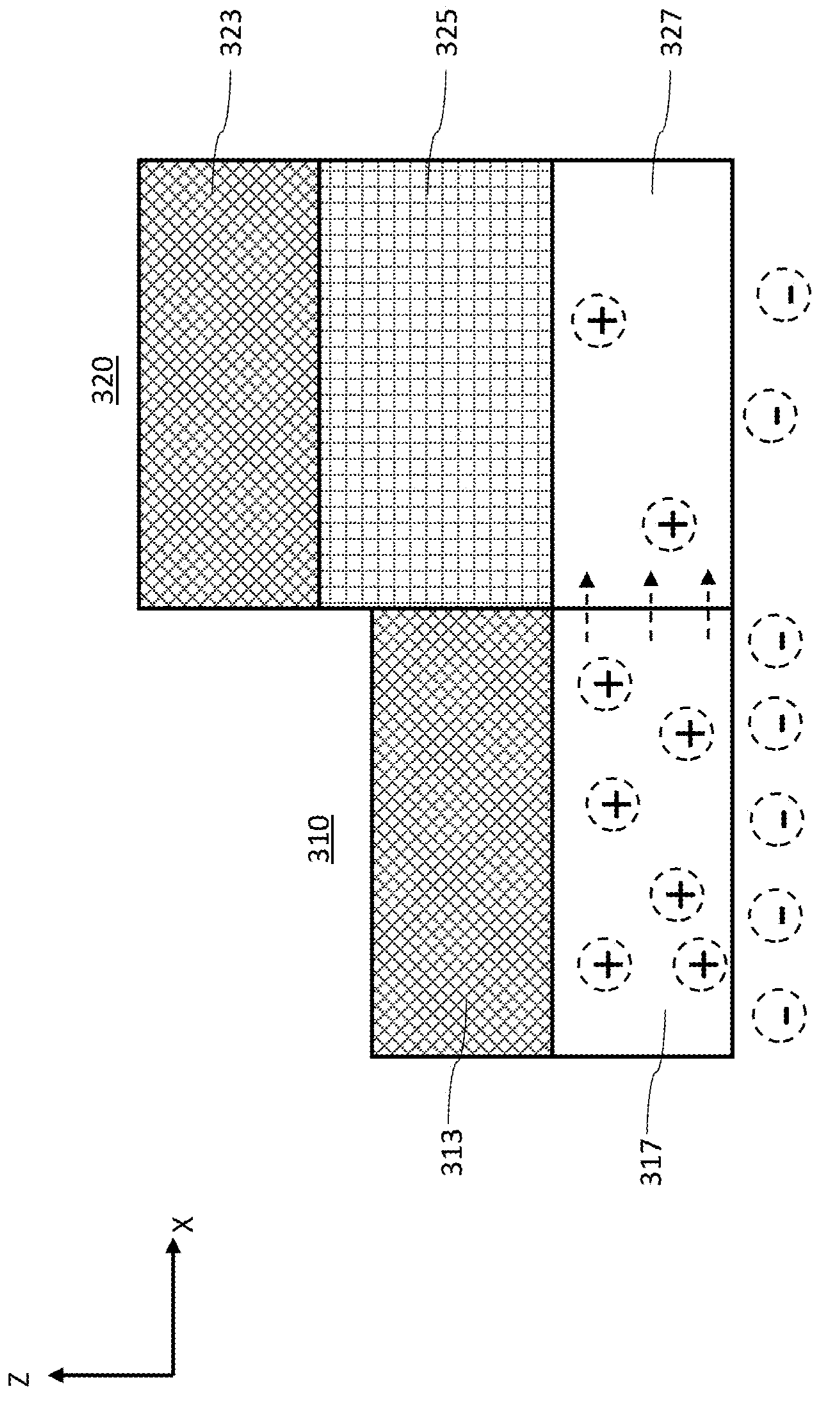
FIG. 3 illustrates vacancy diffusion at a N-P boundary, according to some embodiments of the disclosure.

FIG. 3 illustrates vacancy diffusion at a N-P boundary, according to some embodiments of the disclosure. FIG. 3 shows two gates 310 and 330. In some embodiments, the gate 310 is a gate of a N-type transistor, such as a NMOS transistor. The gate 310 may be an embodiment of the gate structure 168 in FIG. 1, the gate 453 or the gate structure 463 in FIG. 4, or the gate 543 or the gate structure 563 in FIG. 5. The gate 310 may be referred to as a N-type gate. The gate 320 is a gate of a P-type transistor, such as a PMOS transistor. The gate 320 may be referred to as a P-type gate. The gate 320 may be an embodiment of the gate of each transistor 170 in FIG. 1, the gate 443 in FIG. 4, or the gate 553 in FIG. 5. The gate 310 includes a conductive structure 313 and an insulative structure 317. The gate 320 includes conductive structures 323 and 325 and an insulative structure 327. In other embodiments, the gate 310 or 320 may include fewer, more, or different components.

The conductive structure 313 may include the same conductive material as the conductive structure 323. In an example, the conductive material may be Titanium Aluminum Carbide. The conductive structure 313 or 323 may have a thickness along the Z axis in a range from approximately 3 nm to 5 nm. In other embodiments, the conductive structure 313 or 323 may include one or more different materials or have a different thickness. The conductive structure 325 may include a different conductive material from the conductive structure 313 or 323. In an example, the conductive structure 325 may include Titanium Nitride.

The insulative structure 317 or 327 includes one or more insulators, such as dielectric material, hysteretic material, and so on. Example dielectric material includes oxide (e.g., Si based oxides, metal oxides, etc.), high-k dielectric, and so on. Example hysteretic material include ferroelectric materials, antiferroelectric materials, and so on. In some embodiments, the insulative structures 317 and 327 may include the same dielectric material.

Each of the insulative structures 317 and 327 has vacancies with positive polarity. The vacancies may include oxygen vacancies, hydrogen vacancies, other vacancies, or some combination thereof. However, the insulative structure 317 has more vacancies than the insulative structure 327, as the gate 310 is in a N-type transistor versus the gate 320 is in a P-type transistor. The concentration of vacancies (e.g., the number of vacancies in a unit volume) in the insulative structure 317 may also be higher than the concentration of vacancies in the insulative structure 327. Given the difference in the number or concentration of vacancies in the insulative structures 317 and 327, the vacancies may move from the insulative structure 317 into the insulative structure 327, as illustrated by the arrows in FIG. 3. Such vacancy diffusion constitutes N-P boundary effect that causes the insulative structures 317 to have less vacancies and the insulative structures 327 to have more vacancies. As a result, the positive polarity in the gate 310 and the negative polarity in the gate 320 are both weakened. Thus, the N-P boundary effect can result in higher threshold voltages for both transistors.

Figure 4:
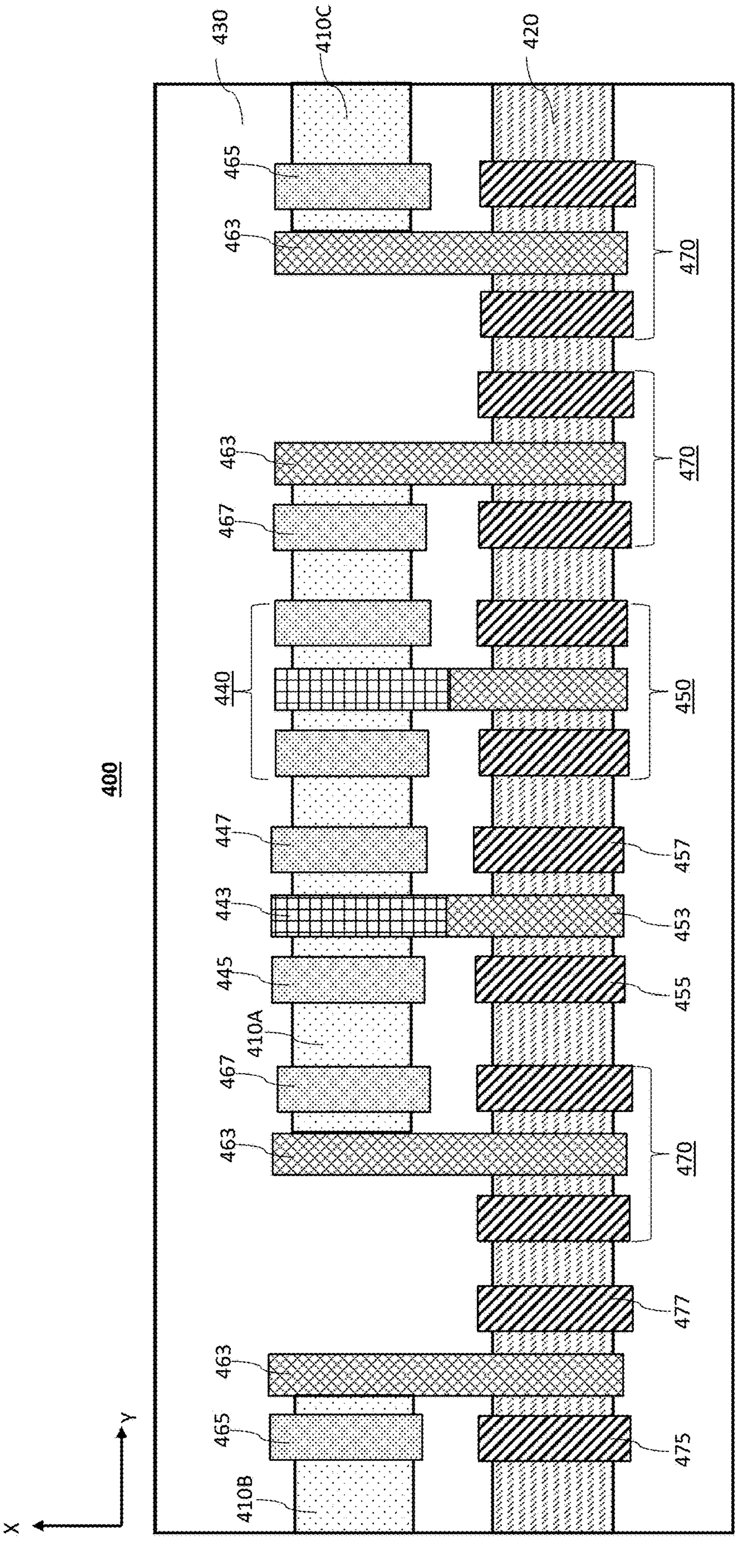
FIG. 4 illustrates an IC device with reduced N-P boundary effect, according to some embodiments of the disclosure.

FIG. 4 illustrates an IC device 400 with reduced N-P boundary effect, according to some embodiments of the disclosure. The IC device 400 includes three support structures 410A-410C (collectively referred to as "support structures 410" or "support structure 410"), a support structure 420, an electrical insulator 430, two transistors 440 (individually referred to as "transistor 440"), two transistors 450 (individually referred to as "transistor 450"), four transistors 470 (individually referred to as "transistor 470"), four gate structures 463 (individually referred to as "gate structure 463"), two semiconductor regions 465 (individually referred to as "semiconductor region 465"), and semiconductor regions 467 (individually referred to as "semiconductor region 467"). In other embodiments, the IC device 400 may include fewer, more, or different components. The IC device 400 may be used as a memory device or part of a memory device, such as SRAM. In some embodiments, the IC device 400 may be used as at least part of a register file. The IC device 400 (or part of the IC device 400) may be an embodiment of the IC device 100 (or part of the IC device 100) in FIG. 1.

Each support structure 410 or the support structure 420 may include one or more semiconductor materials. The support structure 410A may facilitate formation of semiconductor regions (e.g., source region, drain region, channel region, or some combination thereof) of the two transistors 440. The support structure 410A may also facilitate formation of the semiconductor regions 467. The support structures 410B and 410C may facilitate formation of the two semiconductor regions 465, respectively. The support structures 410 may define a first row in the IC device 400, which may include the support structures 410, the transistors 440, the semiconductor regions 465 and 467, and portions of the gate structures 463.

The support structure 420 may facilitate formation of semiconductor regions (e.g., source region, drain region, channel region, or some combination thereof) of the two transistors 450 and the four transistors 470. In some embodiments, a support structure 410 or 420 may be a semiconductor substrate based on which transistors (e.g., the transistors 440, 450, or 470) can be formed. A support structure 410 may be a substrate for forming P-type transistors, e.g., PMOS transistors. The support structures 420 may be a substrate for forming N-type transistors, e.g., NMOS transistors. In some embodiments, the support structures 410 and 420 may include opposite types of semiconductors. For instance, each support structure 410 may be a N-type semiconductor substrate, while the support structure 420 may be a P-type semiconductor substrate. The support structure 420 may define a second row in the IC device 400, which may include the support structure 420, the transistors 450 and 470, and portions of the gate structures 463. In other embodiments, the IC device 400 may include more support structures or more rows.

Each support structure 410 or the support structure 420 may have a longitudinal axis along the Y axis. Each support structure 410 or the support structure 420 may have a transvers cross-section perpendicular to the longitudinal axis. For instance, the transvers cross-section may be in the X-Z plane. In some embodiments, a dimension of each support structure 410 or the support structure 420 along the longitudinal axis may be greater than dimensions along other directions, e.g., directions along axes perpendicular to the longitudinal axis. Each support structure 410 may be an embodiment of the support structure 115 in FIG. 1.

The support structures 410 and 420 (or the transistors 440, 450, and 470) may be partially or wholly surrounded by the electrical insulator 430. The electrical insulator 430 may separate and insulate semiconductor components or conductive components in the support structures 410 and 420 (or the transistors 440, 450, and 470). The electrical insulator 430 may include one or more electrical insulative materials, such as a dielectric material, hysteretic material, and so on. Example dielectric material includes oxide (e.g., Si based oxides, metal oxides, etc.), high-k dielectric, and so on. Example hysteretic material include ferroelectric materials, antiferroelectric materials, and so on.

The IC device 400 include both P-type transistors and N-type transistors. The transistors 440 may be the same type of transistor as each other. The transistors 450 may be the same type of transistor as each other. The transistors 470 may be the same type of transistor as each other. In some embodiments, the transistors 450 may be an opposite type of transistors from the transistors 440 but the same type as the transistors 470. For instance, the transistors 440 may be P-type transistors, while the transistors 450 and 470 may be N-type transistors. In some embodiments, the transistors 450 may be pull-down transistors. The transistors 470 may be pass-gate transistors.

A transistor 440 may be an embodiment of a transistor 170 in FIG. 1. Each transistor 440 includes a gate 443, a source region 445, and a drain region 447. In some embodiments (e.g., embodiments where each transistor 440 is a P-type transistor), the gate 443 may include one or more P-type gate electrodes. The gate 443 may also include a gate insulator. An example of the gate 443 may be the gate 320 in FIG. 3. The source region 445 and drain region 446 may include one or more P-type semiconductor materials. Even though now shown in FIG. 4, a transistor 440 also includes a channel region between the source region 445 and drain region 446. The channel region may be the portion of the support structure 410, which may be a N-type semiconductor substrate. The channel region may be over the gate 443, e.g., along a Z axis that is perpendicular to the X-Y plane. The channel region may be at least partially wrapped by the gate insulator in the gate 443.

In some embodiments (e.g., embodiments where each transistor 450 is a N-type transistor), the gate 453 may include one or more N-type gate electrodes. The gate 453 may also include a gate insulator. An example of the gate 453 may be the gate 310 in FIG. 3. The source region 455 and drain region 456 may include one or more N-type semiconductor materials. Even though now shown in FIG. 4, a transistor 450 also includes a channel region between the source region 455 and drain region 456. The channel region may be the portion of the support structure 420, which may be a P-type semiconductor substrate. The channel region may be over the gate 453, e.g., along a Z axis that is perpendicular to the X-Y plane. As shown in FIG. 4, each gate 443 contacts a gate 453. That may cause N-P boundary effect (such as the N-P boundary effect described below in conjunction with FIG. 3) in the IC device 400.

Each transistor 470 includes a source region 475, and a drain region 477. Each transistor 470 also includes a portion of a gate structure 463, which constitute the gate (or a portion of the gate, e.g., the gate electrode) of the transistor 470. The portion of the gate structure 463 may be the portion that is between the source region 475 and drain region 477 in a direction along the Y axis. In some embodiments (e.g., embodiments where each transistor 450 is a N-type transistor), the gate structure 463 may have the same or similar conductive material(s) as a gate 453. An example of the gate structure 463 may be the conductive structure 313 in FIG. 3. The source region 475 and drain region 476 may include one or more N-type semiconductor materials. Even though now shown in FIG. 4, a transistor 470 also includes a channel region between the source region 475 and drain region 476. The channel region may be the portion of the support structure 420, which may be a P-type semiconductor substrate. The channel region may be over the portion of the gate structure 463, e.g., along a Z axis that is perpendicular to the X-Y plane. The channel region may be separated from the portion of the gate structure 463 by a gate insulator. In some embodiments, the channel region may be at least partially wrapped by the gate insulator. The gate insulator may be at least partially wrapped by the portion of the gate structure 463.

Another portion of each gate structure 463 is between the semiconductor regions 465 and 467 in a direction along the Y axis. A semiconductor region 465 or 467 may be the same or similar as the source region 445 or drain region 447. This portion of each gate structure 463 is not over any of the support structures 410 or the support structure 420 in the direction perpendicular to the X-Y plane and may not function as a gate electrode of any transistor. There may be no semiconductor structure or semiconductor region over the unfunctional portion of the gate structure 463 in the direction perpendicular to the X-Y plane. In some embodiments, a single support structure may be formed across the electrical insulator 430 along the Y axis, then two portions of the support structure may be removed to form the three support structures 410 in FIG. 4. The unfunctional portion of the gate structure 463 may be at least partially surrounded by the electrical insulator 430. In some embodiments, the unfunctional portion of the gate structure 463 may contact the electrical insulator 430. The electrical insulator 430 can separate the unfunctional portion of the gate structure 463 from other components in the IC device 400.

Different from the combination of a gate 443 and a gate 453, a gate structure 463 does not have a N-P boundary. As the gate of each transistor 470 does not contact any P-type gate, the layout of the IC device 400 can mitigate N-P boundary effect. Compared with the IC device in FIG. 2, the IC device 400 in FIG. 4 has less the N-P boundary effect and can have lower threshold voltage and better performance.

Figure 5:
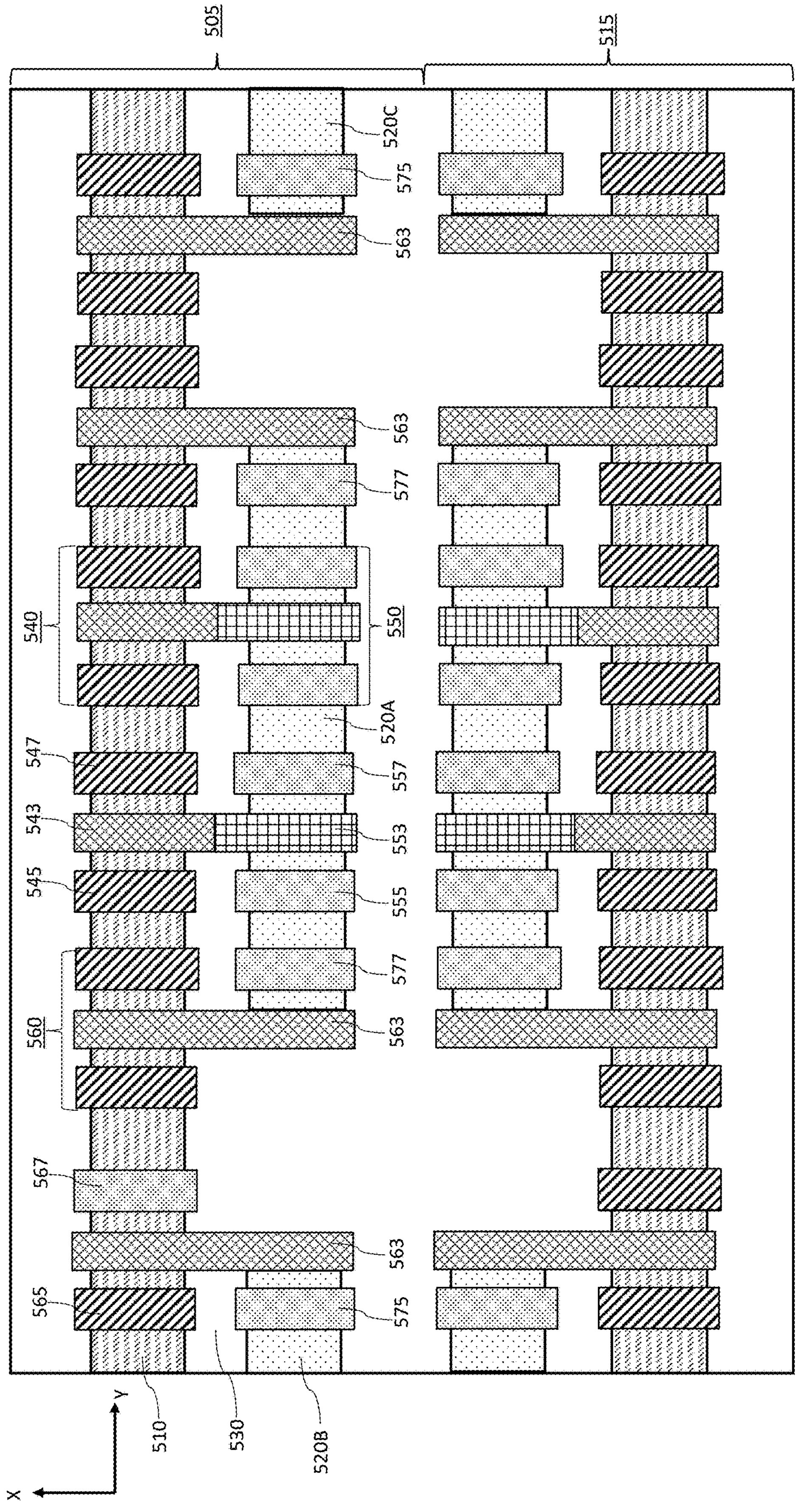
FIG. 5 illustrate another IC device with reduced N-P boundary effect, according to some embodiments of the disclosure.

FIG. 5 illustrate another IC device 500 with reduced N-P boundary effect, according to some embodiments of the disclosure. The IC device 500 may be used as a memory device or part of a memory device, such as SRAM. In some embodiments, the IC device 500 may be used as at least part of a register file. The IC device 500 (or part of the IC device 500) may be an embodiment of the IC device 100 (or part of the IC device 100) in FIG. 1. The IC device 500 includes two sections 505 and 515, each of which includes two rows of transistors. The section 515 may be an embodiment of the IC device 400 in FIG. 4. The section 515 may include the same or similar components (e.g., transistors, etc.) as the IC device 400 in FIG. 4. Also, the section 515 may have the same or similar layout as the IC device 400. For instance, the arrangement of components in the section 515 may be the same or similar layout as the arrangement of components in the IC device 400.

The section 505 includes a support structure 510, support structures 520A-520C (collectively referred to as "support structures 520" or "support structure 520"), an electrical insulator 530, two transistors 540 (individually referred to as "transistor 540"), two transistors 550 (individually referred to as "transistor 550"), four transistors 560 (individually referred to as "transistor 560"), gate structures 563 (individually referred to as "gate structure 563"), semiconductor regions 575 (individually referred to as "semiconductor region 575"), semiconductor regions 577 (individually referred to as "semiconductor region 577"). The sections 550 and 555 may share the electrical insulator 530. In other embodiments, the IC device 500 may include fewer, more, or different components.

The support structure 510 or each support structure 520 may include one or more semiconductor materials. The support structure 510 may facilitate formation of semiconductor regions (e.g., source region, drain region, channel region, or some combination thereof) in the two transistors 540 and the four transistors 560. The support structure 510 may define a row in section 505, which may include the support structure 510, the transistors 540 and 560, and portions of the gate structures 563.

The support structure 520A may facilitate formation of semiconductor regions (e.g., source region, drain region, channel region, or some combination thereof) in the two transistors 550. The support structure 520A may also facilitate formation of the semiconductor regions 577. The support structures 520B and 520C may facilitate formation of the two semiconductor regions 575, respectively. In some embodiments, a support structure 510 or 520 may be a semiconductor substrate based on which transistors (e.g., the transistors 540, 550, or 560) can be formed. For instance, N-type transistors (e.g., NMOS transistors) may be formed based on the support structure 510. P-type transistors (e.g., PMOS transistors) may be formed based on a support structure 520. In some embodiments, the support structures 510 and 520 may include opposite types of semiconductors. For instance, the support structure 510 may be a P-type semiconductor substrate, while a support structure 520 may be a N-type semiconductor substrate. The support structures 520 may define another row in the section 505, which may include the support structures 520, the transistors 550, the semiconductor regions 575 and 577, and portions of the gate structures 563. In other embodiments, the section 505 may include more support structures or more rows.

The support structure 510 or each support structure 520 may have a longitudinal axis along the Y axis. The support structure 510 or each support structure 520 may have a transvers cross-section perpendicular to the longitudinal axis. For instance, the transvers cross-section may be in the X-Z plane. In some embodiments, a dimension of the support structure 510 or each support structure 520 along the longitudinal axis may be greater than dimensions along other directions, e.g., directions along axes perpendicular to the longitudinal axis. Each support structure 520 may be an embodiment of the support structure 115 in FIG. 1.

The support structures 510 and 520 (or the transistors 540, 550, and 560) may be partially or wholly surrounded by the electrical insulator 530. The electrical insulator 530 may separate and insulate semiconductor components or conductive components in the support structures 510 and 520 (or the transistors 540, 550, and 560). The electrical insulator 530 may include one or more electrical insulative materials, such as a dielectric material, hysteretic material, and so on. Example dielectric material includes oxide (e.g., Si based oxides, metal oxides, etc.), high-k dielectric, and so on. Example hysteretic material include ferroelectric materials, antiferroelectric materials, and so on.

The section 505 in the IC device 500 includes both P-type transistors and N-type transistors. The transistors 540 may be the same type of transistor as each other. The transistors 550 may be the same type of transistor as each other. The transistors 540 and 560 may be the same type of transistor as each other. In some embodiments, the transistors 540 may be an opposite type of transistors from the transistors 550 but the same type as the transistors 560. For instance, the transistors 540 and 560 may be N-type transistors, while the transistors 550 may be P-type transistors.

Each transistor 540 includes a gate 543, a source region 545, and a drain region 547. In some embodiments (e.g., embodiments where each transistor 540 is a N-type transistor), the gate 543 may include one or more N-type gate electrodes. The gate 543 may also include a gate insulator.

An example of the gate 543 may be the gate 320 in FIG. 3. The source region 545 and drain region 546 may include one or more N-type semiconductor materials. Even though now shown in FIG. 5, a transistor 540 also includes a channel region between the source region 545 and drain region 546. The channel region may be the portion of the support structure 510, which may be a P-type semiconductor substrate. The channel region may be over the gate 543, e.g., along a Z axis that is perpendicular to the X-Y plane. The channel region may be at least partially wrapped by the gate insulator in the gate 543.

A transistor 550 may be an embodiment of a transistor 170 in FIG. 1. Each transistor 550 includes a gate 553, a source region 555, and a drain region 557. In some embodiments (e.g., embodiments where each transistor 550 is a P-type transistor), the gate 553 may include one or more P-type gate electrodes. The gate 553 may also include a gate insulator. An example of the gate 553 may be the gate 320 in FIG. 3. The source region 555 and drain region 556 may include one or more P-type semiconductor materials. Even though now shown in FIG. 5, a transistor 550 also includes a channel region between the source region 555 and drain region 556. The channel region may be the portion of the support structure 520, which may be a N-type semiconductor substrate. The channel region may be over the gate 553, e.g., along a Z axis that is perpendicular to the X-Y plane. As shown in FIG. 5, each gate 543 contacts a gate 553. That can cause N-P boundary effect (such as the N-P boundary effect described below in conjunction with FIG. 3) in the IC device 500.

Each transistor 560 includes a source region 565, and a drain region 567. Each transistor 560 also includes a portion of a gate structure 563, which constitute the gate (or a portion of the gate, e.g., the gate electrode) of the transistor 560. The portion of the gate structure 563 may be the portion that is between the source region 565 and drain region 567 in a direction along the Y axis. In some embodiments (e.g., embodiments where the transistor 560 is a N-type transistor), the gate structure 563 may have the same or similar conductive material(s) as a gate 543. An example of the gate structure 563 may be the conductive structure 313 in FIG. 3. The source region 565 and drain region 566 may include one or more N-type semiconductor materials. Even though now shown in FIG. 4, a transistor 560 also includes a channel region between the source region 565 and drain region 566. The channel region may be the portion of the support structure 510, which may be a P-type semiconductor substrate. The channel region may be over the portion of the gate structure 563, e.g., along a Z axis that is perpendicular to the X-Y plane. The channel region may be separated from the portion of the gate structure 563 by a gate insulator. In some embodiments, the channel region may be at least partially wrapped by the gate insulator. The gate insulator may be at least partially wrapped by the portion of the gate structure 563.

Another portion of each gate structure 563 is between the semiconductor regions 575 and 577 in a direction along the Y axis. A semiconductor region 575 or 577 may be the same or similar as the source region 555 or drain region 557. This portion of each gate structure 563 is not over the support structure 510 or any of the support structures 520 in the direction perpendicular to the X-Y plane and may not function as a gate electrode of any transistor. There may be no semiconductor structure or semiconductor region over the unfunctional portion of the gate structure 563. In some embodiments, a support structure may be formed across the electrical insulator 530 along the Y axis, then two portions of the support structure may be removed to form the support structures 520 in FIG. 5. The unfunctional portion of the gate structure 563 may be at least partially surrounded by the electrical insulator 530. In some embodiments, the unfunctional portion of the gate structure 563 may contact the electrical insulator 530. The electrical insulator 530 can separate the unfunctional portion of the gate structure 563 from other components in the IC device 500.

As the gates of the transistors 560 do not contact opposite type gates, the layout of the IC device 500 can mitigate N-P boundary effect. Compared with the IC device in FIG. 2, the IC device 500 in FIG. 5 has less the N-P boundary effect and can have lower threshold voltage and better performance.

Figure 6B:
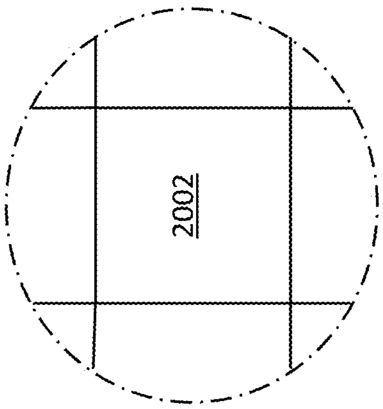
FIGS. 6A-6B are top views of a wafer and dies, according to some embodiments of the disclosure.
Figure 6A:
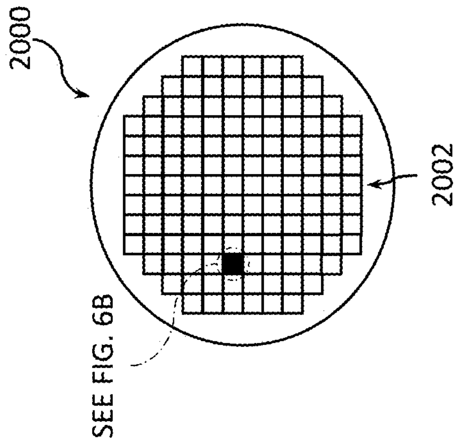

FIGS. 6A-6B are top views of a wafer 2000 and dies 2002, according to some embodiments of the disclosure. In some embodiments, the dies 2002 may be included in an IC package, according to some embodiments of the disclosure. For example, any of the dies 2002 may serve as any of the dies 2256 in an IC package 2200 shown in FIG. 7. The wafer 2000 may be composed of semiconductor material and may include one or more dies 2002 having IC devices formed on a surface of the wafer 2000. Each of the dies 2002 may be a repeating unit of a semiconductor product that includes any suitable IC (e.g., ICs with reduced N-P boundary effect as described herein). After the fabrication of the semiconductor product is complete, the wafer 2000 may undergo a singulation process in which each of the dies 2002 is separated from one another to provide discrete "chips" of the semiconductor product. In particular, devices with reduced N-P boundary effect as disclosed herein may take the form of the wafer 2000 (e.g., not singulated) or the form of the die 2002 (e.g., singulated). The die 2002 may include one or more diodes, one or more transistors as well as, optionally, supporting circuitry to route electrical signals to the III-N diodes with n-doped wells and capping layers and III-N transistors, as well as any other IC components. In some embodiments, the wafer 2000 or the die 2002 may implement an electrostatic discharge (ESD) protection device, a radio frequency front-end device, a memory device (e.g., a SRAM device), a logic device (e.g., an AND, OR, NAND, or NOR gate), or any other suitable circuit element. Multiple ones of these devices may be combined on a single die 2002.

Figure 7:
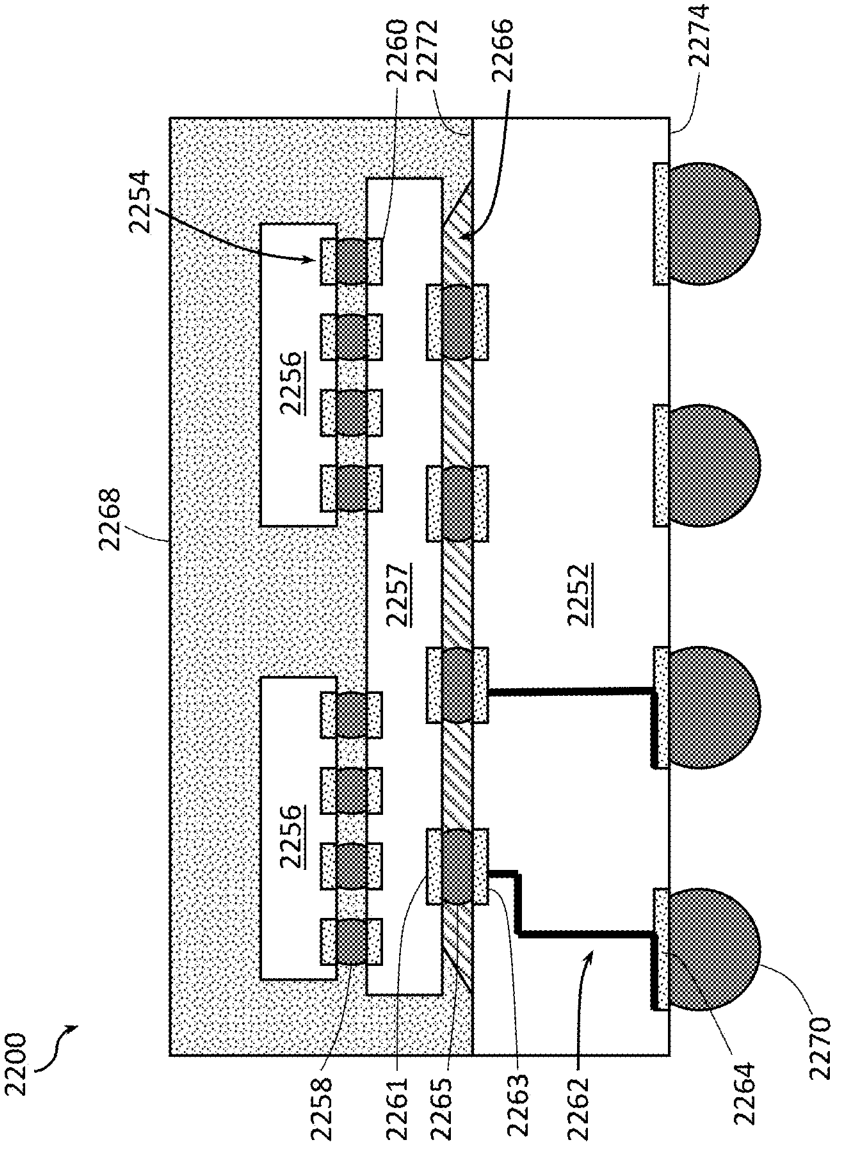
FIG. 7 is a side, cross-sectional view of an example IC package that may include one or more IC devices with reduced N-P boundary effect, according to some embodiments of the disclosure.

FIG. 7 is a side, cross-sectional view of an example IC package 2200 that may include one or more IC devices with reduced N-P boundary effect, according to some embodiments of the disclosure. In some embodiments, the IC package 2200 may be a system-in-package (SiP).

As shown in FIG. 7, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 7 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 7 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 7 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 8.

The dies 2256 may take the form of any of the embodiments of the die 2002 discussed herein and may include any of the embodiments of an IC device with reduced N-P boundary effect. In embodiments in which the IC package 2200 includes multiple dies 2256, the IC package 2200 may be referred to as a multi-chip package. Importantly, even in such embodiments of an MCP implementation of the IC package 2200, one or more IC devices with reduced N-P boundary effect may be provided in a single chip, in accordance with any of the embodiments described herein. The dies 2256 may include circuitry to perform any desired functionality. For example, one or more of the dies 2256 may be ESD protection dies, including one or more IC devices with reduced N-P boundary effect as described herein, one or more of the dies 2256 may be logic dies (e.g., silicon-based dies), one or more of the dies 2256 may be memory dies (e.g., high bandwidth memory), etc. In some embodiments, any of the dies 2256 may include or otherwise be associated with one or more component with reduced N-P boundary effect, e.g., as discussed above; in some embodiments, at least some of the dies 2256 may not include any III-N diodes with n-doped wells and capping layers.

The IC package 2200 illustrated in FIG. 7 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 7, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 8:
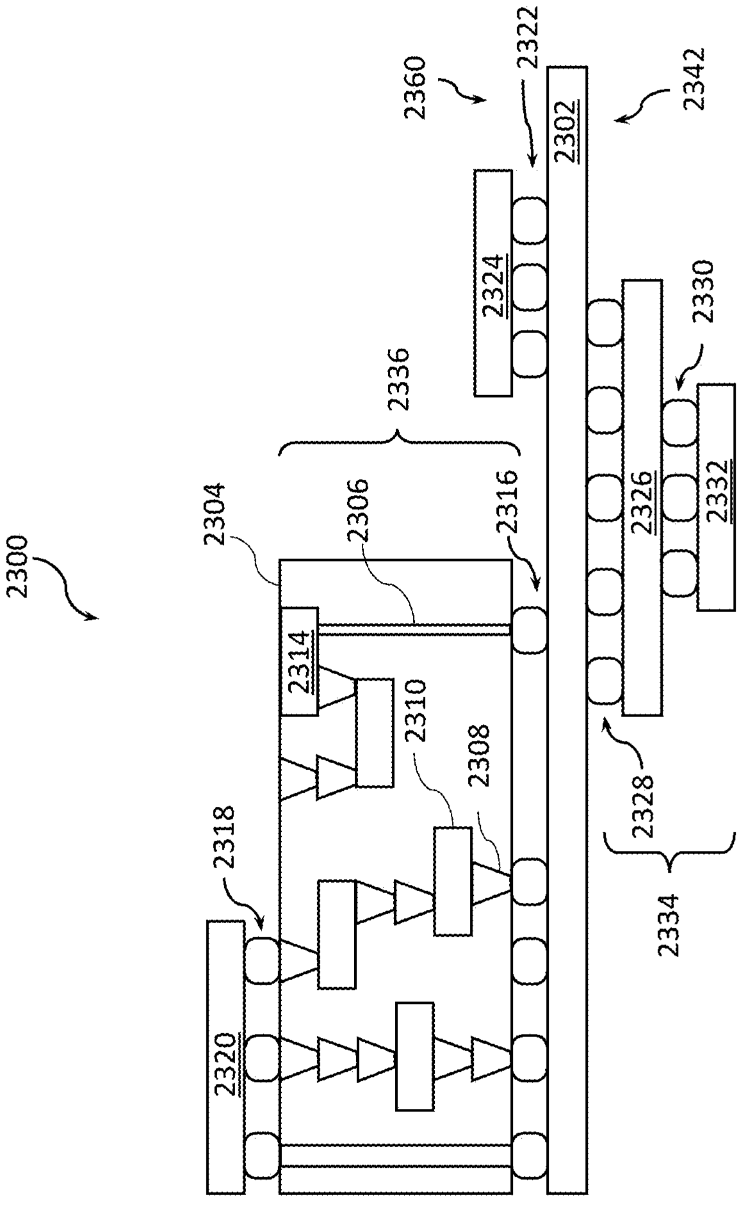
FIG. 8 is a cross-sectional side view of an IC device assembly that may include components having one or more IC devices with reduced N-P boundary effect, according to some embodiments of the disclosure.

FIG. 8 is a cross-sectional side view of an IC device assembly 2300 that may include components having one or more IC devices with reduced N-P boundary effect, according to some embodiments of the disclosure. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices with reduced N-P boundary effect in accordance with any of the embodiments disclosed herein; e.g., any of the IC packages discussed below with reference to the IC device assembly 2300 may take the form of any of the embodiments of the IC package 2200 discussed above with reference to FIG. 7 (e.g., may include one or more components with reduced N-P boundary effect in/on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 8 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 8), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 6B), an IC device (e.g., the IC device of FIGS. 1-2), or any other suitable component. In particular, the IC package 2320 may include one or more devices with reduced N-P boundary effect as described herein. Although a single IC package 2320 is shown in FIG. 8, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 8, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF (radio frequency) devices, power amplifiers, power management devices, antennas, arrays, sensors, and microelectromechanical systems (MEMS) devices may also be formed on the interposer 2304. In some embodiments, the IC devices with reduced N-P boundary effect as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 8 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 9:
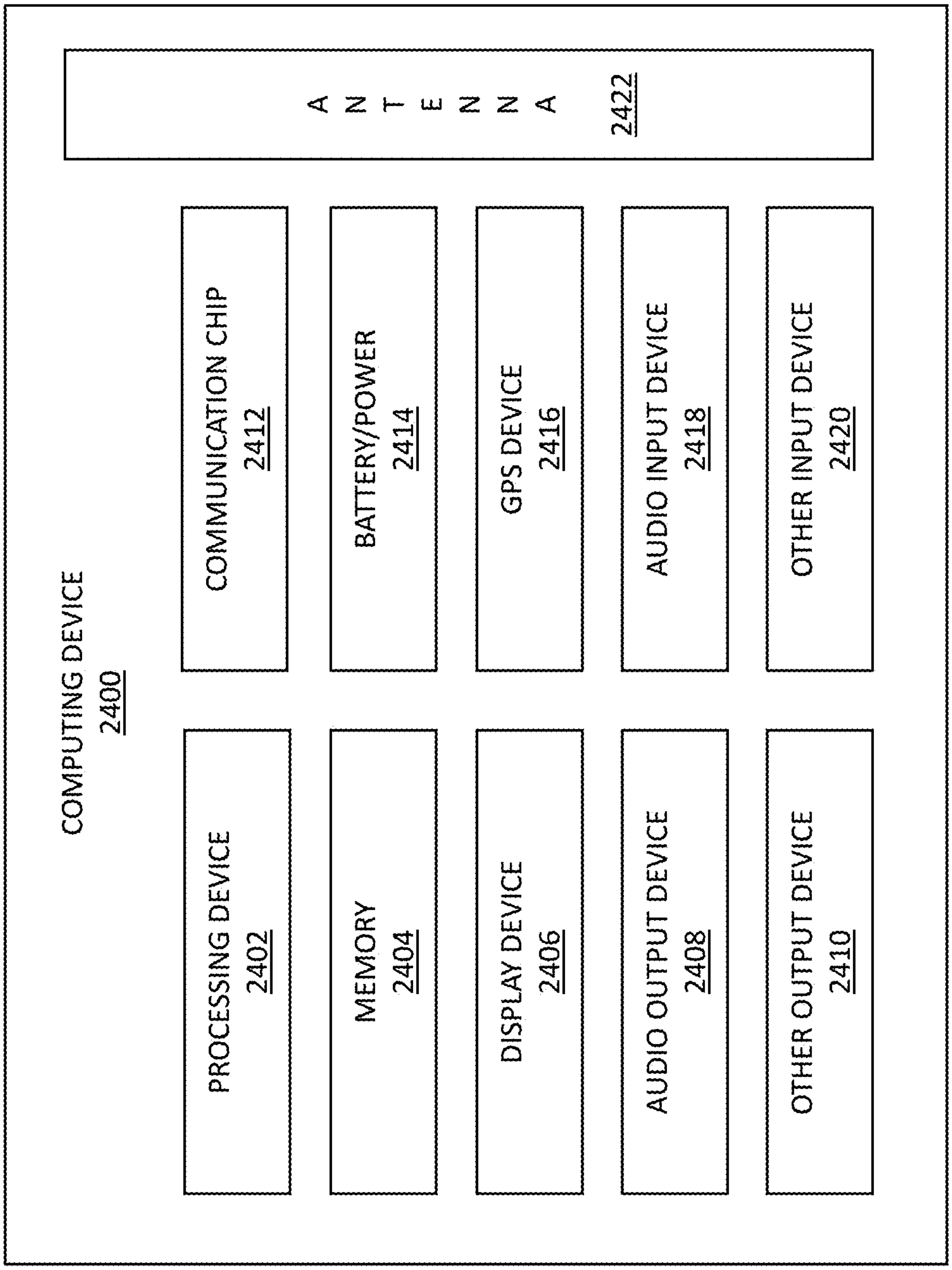
FIG. 9 is a block diagram of an example computing device that may include one or more components with reduced N-P boundary effect, according to some embodiments of the disclosure.

FIG. 9 is a block diagram of an example computing device 2400 that may include one or more components with one or more IC devices with reduced N-P boundary effect, according to some embodiments of the disclosure. For example, any suitable ones of the components of the computing device 2400 may include a die (e.g., the die 2002 of FIG. 6B) including or associated with devices with reduced N-P boundary effect, according to some embodiments of the disclosure. Any of the components of the computing device 2400 may include an IC device with reduced N-P boundary effect (e.g., any embodiment of the IC devices described above in conjunction with FIGS. 1, 4, and 5) and/or an IC package (e.g., the IC package 2200 of FIG. 7). Any of the components of the computing device 2400 may include an IC device assembly (e.g., the IC device assembly 2300 of FIG. 8).

A number of components are illustrated in FIG. 9 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC (system-on-chip) die.

Additionally, in various embodiments, the computing device 2400 may not include one or more of the components illustrated in FIG. 9, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC devices with reduced N-P boundary effect as described herein may be particularly advantageous for use as part of ESD circuits protecting power amplifiers, low-noise amplifiers, filters (including arrays of filters and filter banks), switches, or other active components. In some embodiments, IC devices with reduced N-P boundary effect as described herein may be used in PMICs, e.g., as a rectifying diode for large currents. In some embodiments, IC devices with reduced N-P boundary effect as described herein may be used in audio devices and/or in various input/output devices.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include another output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include another input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA); an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

The following paragraphs provide various examples of the embodiments disclosed herein.

Example 1 provides an IC device, including a first transistor including a first gate, where at least part of the first gate is over a first semiconductor structure in a first direction, and the first semiconductor structure has a longitudinal axis in a second direction substantially perpendicular to the first direction; a second transistor including a second gate, where at least part of the second gate is over a second semiconductor structure in the first direction, the second semiconductor structure has a longitudinal axis in the second direction, and the second gate includes a different material from the first gate and contacts the first gate; a gate structure having a longitudinal axis along a third direction substantially perpendicular to the first direction and the second direction, the gate structure including a first portion and a second portion, where the first portion is over an electrical insulator in the first direction; and a third transistor including a portion of the second semiconductor structure, where at least part of the second portion of the gate structure is over the portion of the second semiconductor structure in the first direction.

Example 2 provides the IC device according to example 1, where the first gate includes a first gate electrode and a first gate insulator, the second gate includes a second gate electrode and a second gate insulator, and the first gate insulator contacts the second gate insulator.

Example 3 provides the IC device according to example 1 or 2, where the gate structure or the second gate includes a first conductive material, the first gate includes the first conductive material and a second conductive material, and the second conductive material is different from the first conductive material.

Example 4 provides the IC device according to example 3, where the first gate includes a layer of the first conductive material and a layer of the second conductive material, and the layer of the first conductive material is over the layer of the first conductive material in the first direction.

Example 5 provides the IC device according to example 3 or 4, where the first conductive material includes a Titanium Aluminum Carbide, and the second conductive material includes a Titanium Nitride.

Example 6 provides the IC device according to any of the preceding examples, where: the second transistor is a pull-down transistor, and the third transistor is a pass-gate transistor.

Example 7 provides the IC device according to any of the preceding examples, where the first semiconductor structure includes a N-type semiconductor material, and the second semiconductor structure includes a P-type semiconductor material.

Example 8 provides an IC device, including a first semiconductor structure including a P-type semiconductor material; a second semiconductor structure including a N-type semiconductor material, where the second semiconductor structure has a longitudinal axis that is along a first direction and is substantially parallel to a longitudinal axis of the first semiconductor structure; an electrical insulator over the first semiconductor structure and the second semiconductor structure in a second direction substantially perpendicular to the first direction; a conductive structure including a N-type conductive material, where a first portion of the conductive structure is over a portion of the first semiconductor structure in the second direction, and a second portion of the conductive structure is over a portion of the electrical insulator in the second direction.

Example 9 provides the IC device according to example 8, further including a first conductive structure, where at least part of the first conductive structure is over the first semiconductor structure in the second direction; and a second conductive structure, where at least part of the second conductive structure is over the second semiconductor structure in the second direction, where the first conductive structure includes a different material from the second conductive structure, and the first conductive structure contacts the second conductive structure.

Example 10 provides the IC device according to example 9, where the second conductive structure is a gate electrode of P-type transistor.

Example 11 provides the IC device according to example 9 or 10, where the first conductive structure is a gate electrode of a N-type transistor.

Example 12 provides the IC device according to any one of examples 9-11, where the first conductive structure includes a same material as the conductive structure.

Example 13 provides the IC device according to any one of examples 8-11, where the second portion of the conductive structure contacts the electrical insulator.

Example 14 provides the IC device according to any one of examples 8-13, where the N-type conductive material includes Titanium Aluminum Carbide.

Example 15 provides an IC device, including a gate structure including a first portion and a second portion, the first portion crossing a first semiconductor structure, the second portion crossing a second semiconductor structure; a P-type transistor including a portion of the first semiconductor structure; a first N-type transistor including a first portion of the second semiconductor structure; and a second N-type transistor including a second portion of the second semiconductor structure, where at least part of the second portion of the second semiconductor structure is over at least part of the second portion of the gate structure.

Example 16 provides the IC device according to example 15, where the first N-type transistor is a pull-down transistor, and the second N-type transistor is a pass-gate transistor.

Example 17 provides the IC device according to example 15 or 16, where a gate electrode of the P-type transistor includes a first layer and a second layer, the first layer is over the second layer, the first layer includes a first conductive material, and the second layer includes a second conductive material that is different from the first conductive material.

Example 18 provides the IC device according to example 17, where the first layer has a thickness in a range from approximately 3 nanometers to approximately 5 nanometers.

Example 19 provides the IC device according to example 17 or 18, where the second layer has a thickness in a range from approximately 1 nanometer to approximately 5 nanometers.

Example 20 provides the IC device according to any one of examples 15-19, where the first portion of the gate structure is over an electrical insulator, and the first portion of the gate structure contacts the electrical insulator.

Example 21 provides an IC package, including the IC device according to any one of examples 1-14; and a further IC component, coupled to the device.

Example 22 provides the IC package according to example 21, where the further IC component includes one of a package substrate, an interposer, or a further IC die.

Example 23 provides the IC package according to example 21 or 22, where the IC device according to any one of examples 1-20 may include, or be a part of, at least one of a memory device, a computing device, a wearable device, a handheld electronic device, and a wireless communications device.

Example 24 provides an electronic device, including a carrier substrate; and one or more of the IC devices according to any one of examples 1-20 and the IC package according to any one of examples 21-23, coupled to the carrier substrate.

Example 25 provides the electronic device according to example 24, where the carrier substrate is a motherboard.

Example 26 provides the electronic device according to example 24, where the carrier substrate is a PCB.

Example 27 provides the electronic device according to any one of examples 24-26, where the electronic device is a wearable electronic device or handheld electronic device.

Example 28 provides the electronic device according to any one of examples 24-27, where the electronic device further includes one or more communication chips and an antenna.

Example 29 provides the electronic device according to any one of examples 24-28, where the electronic device is an RF transceiver.

Example 30 provides the electronic device according to any one of examples 24-28, where the electronic device is one of a switch, a power amplifier, a low-noise amplifier, a filter, a filter bank, a duplexer, an upconverter, or a downconverter of an RF communications device, e.g., of an RF transceiver.

Example 31 provides the electronic device according to any one of examples 24-30, where the electronic device is a computing device.

Example 32 provides the electronic device according to any one of examples 24-31, where the electronic device is included in a base station of a wireless communication system.

Example 33 provides the electronic device according to any one of examples 24-31, where the electronic device is included in a user equipment device of a wireless communication system.

Example 34 provides processes for forming the IC device according to any one of examples 1-20.

Example 35 provides processes for forming the IC package according to any one of the examples 21-23.

Example 36 provides processes for forming the electronic device according to any one of the examples 24-33.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:

a first transistor comprising a first gate, wherein at least part of the first gate is over a first semiconductor structure in a first direction, and the first semiconductor structure has a longitudinal axis in a second direction substantially perpendicular to the first direction;

a second transistor comprising a second gate, wherein at least part of the second gate is over a second semiconductor structure in the first direction, the second semiconductor structure has a longitudinal axis in the second direction, and the second gate comprises a different material from the first gate and contacts the first gate;

a gate structure having a longitudinal axis along a third direction substantially perpendicular to the first direction and the second direction, the gate structure comprising a first portion and a second portion, wherein the first portion is over an electrical insulator in the first direction; and a third transistor comprising a portion of the second semiconductor structure, wherein at least part of the second portion of the gate structure is over at least part of the portion of the second semiconductor structure in the first direction.

2. The IC device according to claim 1, wherein:

the first gate comprises a first gate electrode and a first gate insulator, the second gate comprises a second gate electrode and a second gate insulator, and the first gate insulator contacts the second gate insulator.

3. The IC device according to claim 1, wherein:

the gate structure or the second gate comprises a first conductive material, the first gate comprises the first conductive material and a second conductive material, and the second conductive material is different from the first conductive material.

4. The IC device according to claim 3, wherein:

the first gate comprises a layer of the first conductive material and a layer of the second conductive material, and the layer of the first conductive material is over the layer of the first conductive material in the first direction.

5. The IC device according to claim 3, wherein:

the first conductive material comprises Titanium Aluminum Carbide, and the second conductive material comprises Titanium Nitride.

6. The IC device according to claim 1, wherein the second transistor is a pull-down transistor, and the third transistor is a pass-gate transistor.

7. The IC device according to claim 1, wherein the first semiconductor structure comprises a N-type semiconductor material, and the second semiconductor structure comprises a P-type semiconductor material.

8. An integrated circuit (IC) device, comprising:

a first semiconductor structure comprising a P-type semiconductor material;

a second semiconductor structure comprising a N-type semiconductor material, wherein the second semiconductor structure has a longitudinal axis that is along a first direction and is substantially parallel to a longitudinal axis of the first semiconductor structure;

an electrical insulator over the first semiconductor structure and the second semiconductor structure in a second direction substantially perpendicular to the first direction; and a conductive structure comprising a N-type conductive material, wherein a first portion of the conductive structure is over a portion of the first semiconductor structure in the second direction, and a second portion of the conductive structure is over a portion of the electrical insulator in the second direction.

9. The IC device according to claim 8, further comprising:

a first conductive structure, wherein at least part of the first conductive structure is over the first semiconductor structure in the second direction; and a second conductive structure, wherein at least part of the second conductive structure is over the second semiconductor structure in the second direction, wherein the first conductive structure comprises a different material from the second conductive structure, and the first conductive structure contacts the second conductive structure.

10. The IC device according to claim 9, wherein the second conductive structure is a gate electrode of P-type transistor.

11. The IC device according to claim 9, wherein the first conductive structure is a gate electrode of a N-type transistor.

12. The IC device according to claim 9, wherein the first conductive structure comprises a same material as the conductive structure.

13. The IC device according to claim 8, wherein the second portion of the conductive structure contacts the electrical insulator.

14. The IC device according to claim 8, wherein the N-type conductive material comprises Titanium Aluminum Carbide.

15. An integrated circuit (IC) device, comprising:

a gate structure comprising a first portion and a second portion, the first portion crossing a first semiconductor structure, the second portion crossing a second semiconductor structure;

a P-type transistor comprising a portion of the first semiconductor structure;

a first N-type transistor comprising a first portion of the second semiconductor structure; and a second N-type transistor comprising a second portion of the second semiconductor structure, wherein at least part of the second portion of the second semiconductor structure is over at least part of the second portion of the gate structure.

16. The IC device according to claim 15, wherein the first N-type transistor is a pull-down transistor, and the second N-type transistor is a pass-gate transistor.

17. The IC device according to claim 15, wherein:

a gate electrode of the P-type transistor comprises a first layer and a second layer, the first layer is over the second layer, the first layer comprises a first conductive material, and the second layer comprises a second conductive material that is different from the first conductive material.

18. The IC device according to claim 17, wherein the first layer has a thickness in a range from approximately 3 nanometers to approximately 5 nanometers.

19. The IC device according to claim 17, wherein the second layer has a thickness in a range from approximately 1 nanometer to approximately 5 nanometers.

20. The IC device according to claim 15, wherein the first portion of the gate structure is over an electrical insulator, and the first portion of the gate structure contacts the electrical insulator.

* * * * *